US007821341B2

(12) United States Patent
Kim et al.

(10) Patent No.: US 7,821,341 B2
(45) Date of Patent: Oct. 26, 2010

(54) GAIN CONTROL DEVICE AND AMPLIFIER USING THE SAME

(75) Inventors: Yi Gyeong Kim, Daejeon (KR); Min Hyung Cho, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/507,701

(22) Filed: Jul. 22, 2009

(65) Prior Publication Data

US 2010/0156534 A1 Jun. 24, 2010

(30) Foreign Application Priority Data

Dec. 22, 2008 (KR) ...................... 10-2008-0131549

(51) Int. Cl.
*H03G 3/10* (2006.01)
(52) U.S. Cl. ...................... 330/284; 330/254
(58) Field of Classification Search ................ 330/284, 330/260, 69, 254, 278
See application file for complete search history.

(56) References Cited

U.S. PATENT DOCUMENTS 5,999,052 A * 12/1999 Tang ........................... 330/254
6,462,615 B1 * 10/2002 Tanghe ........................ 327/560
7,102,441 B2    9/2006 Lee et al.
7,339,434 B1    3/2008 Shirvani-Mahdavi et al.
7,352,238 B2    4/2008 Elwan et al.
7,619,472 B1 * 11/2009 Tekin et al. ................. 330/252

FOREIGN PATENT DOCUMENTS

JP    2007-067541 A    3/2007
KR    1020060091991 A    8/2006

* cited by examiner

*Primary Examiner*—Henry K Choe

(57) ABSTRACT

Provided are a gain control device and an amplifier using the gain control device. The gain control device includes a first input resistance unit having a first variable resistor whose resistance is linearly variable and a first fixed resistor respectively receiving a first input signal and a second input signal having a sign different from the first input signal and outputting current through a first output terminal, and a second input resistance unit having a second fixed resistor and a second variable resistor whose resistance is linearly variable respectively receiving the first input signal and the second input signal and outputting current through a second output terminal.

Since the gain control device can separately perform dB-linear gain control, it is easily combined with a circuit, such as a continuous-time sigma-delta modulator (SDM), a continuous-time filter, and a continuous-time analog-to-digital converter (ADC), and enables miniaturization and low power consumption.

10 Claims, 6 Drawing Sheets

GAIN CONTROL DEVICE AND AMPLIFIER USING THE SAME

CROSS-REFERENCE TO RELATED APPLICATION

This application claims priority to and the benefit of Korean Patent Application No. 10-2008-0131549, filed Dec. 22, 2008, the disclosure of which is incorporated herein by reference in its entirety.

BACKGROUND

1. Field of the Invention

The present invention relates to a device capable of separately controlling dB-linear gain in an analog circuit, and more particularly, to a gain control device not affecting a value of a negative feedback device connected with an operational amplifier in an analog circuit during gain control, and an amplifier using the gain control device.

2. Discussion of Related Art

In general, when many analog signal processing circuits, such as audio signal processing chips, wireless communication systems, and image sensor signal processing chips, perform amplification or attenuation on an input signal, gain of a gain control signal should be dB-linearly controlled to be amplified or attenuated.

The term "dB-linear" means that a log function of an output is linear when a magnitude of an input signal linearly increases. In other words, gain should be expressed by an exponential function with respect to a linear gain control signal in a gain control circuit.

A dB-linear gain control circuit may be implemented using an exponential function characteristic of a bipolar junction transistor (BJT) itself. Lately, most analog circuits are manufactured using a metal-oxide semiconductor field effect transistor (MOSFET) due to low-power circuit design and development of a complementary metal oxide semiconductor (CMOS) process. However, the MOSFET does not have the exponential function characteristic, and thus a circuit for implementing an exponential transfer function is required. Accordingly, various techniques for approximately performing dB-linear gain control have been disclosed.

FIG. 1 illustrates a general dB-linear gain controller, which is an example of a dB-linear programmable gain amplifier (PGA) using a MOSFET.

Referring to FIG. 1, a PGA 100 includes an operational amplifier (OPA) 120, negative feedback resistors 101 and 103, and switching means 111 and 113 controlling the resistances of the resistors 101 and 103 to vary, and is in a fully differential form.

An input/output transfer function of the PGA 100 may be expressed by Equation 1 below.

$$I_{TP} = \frac{1+x}{1-x} \cdot \frac{1}{R_{REF}} \cdot Vinp \qquad <\text{Equation 1}>$$

Here, x denotes a gain control input signal variable, Vinp and Vinn denote input signals, and Voutp and Voutn denote output signals.

Referring to Equation 1 above, gain of input signal difference is $$\frac{1+x}{1-x}.$$

This value approximates $10^x$, and gain has an approximately exponential shape with respect to the gain control input signal variable x.

FIG. 2 shows graphs of a gain function $$y = \frac{1+x}{1-x}$$

of Equation 1 and an exponential function $y=10^x$, illustrating a function of $20 \cdot \log(y)$ with respect to x ranging from −0.7 to +0.7. Here, the graphs of $y=10^x$ and $$y = \frac{1+x}{1-x}$$

are denoted by reference numerals 201 and 203, respectively. In FIG. 2, the graph 203 of $$y = \frac{1+x}{1-x}$$

is similar to the graph 201 of the exponential function $y=10^x$ with respect to x ranging from about −0.7 to +0.7. In other words, the two functions can approximate each other with respect to a specific range of x, and thus dB-linear gain control is enabled.

Lately, analog circuit design has been geared toward low power and low cost, and functional integration of analog signal processing units such as amplifiers, signal converters, and filters, which are dB-linear gain controllers mentioned above, is required. Thus, the necessity of a gain controller that can be functionally integrated with analog signal processing blocks such as a signal converter and filter, is increasing.

However, general dB-linear gain controllers need to adjust the value of a device negatively feeding back an output of an operational amplifier as an input.

For example, in the PGA 100, that is, the gain control device of FIG. 1, devices connected for negative feedback are resistors 101 and 103, and resistances of the resistors vary to adjust gain. When an analog signal processing unit such as a signal converter and filter is combined with the rear end of the PGA 100 constituted as mentioned above, a signal processing characteristic of the analog signal processing unit is changed by the resistors 101 and 103. Since a change of the values of the negative feedback devices 101 and 103 connected with the operational amplifier 120 leads to changes in an analog signal processing characteristic as well as gain control, it is difficult to combine an analog signal processing unit with the PGA 100.

To solve this problem, an amplifier capable of dB-linear gain control is added to the front end of an analog signal processing unit. However, this structure has an increased volume due to the additional circuit and thus is difficult to be miniaturized and highly integrated. Also, it is difficult to implement a low-power circuit due to increasing power consumption.

SUMMARY OF THE INVENTION

The present invention is directed to providing a gain control device capable of dB-linear gain control by only adjusting an input terminal resistance regardless of a negative feedback device of an analog signal processing unit, and an amplifier including the gain control device.

The present invention is also directed to providing a gain control device capable of dB-linear gain control irrespective of a signal processing characteristic of an analog signal processing unit, and an amplifier including the gain control device.

One aspect of the present invention provides a gain control device comprising: a first input resistance unit having a first variable resistor whose resistance is linearly variable and receiving a first input signal and a first fixed resistor receiving a second input signal having a sign different from the first input signal, adding signals output from the first fixed resistor and the first variable resistor, and outputting a first output current through a first output terminal; and a second input resistance unit having a second fixed resistor receiving the first input signal and a second variable resistor whose resistance is linearly variable and receiving the second input signal, adding signals output from the second fixed resistor and the second variable resistor, and outputting a second output current through a second output terminal.

The first fixed resistor and the second fixed resistor may have the same resistance, and the first variable resistor and the second variable resistor may have the same maximum resistance.

The first and second output terminals may be virtual ground nodes.

The first output current may be expressed by the following equation:

$$I_{TP} = \frac{1+x}{1-x} \cdot \frac{1}{R_{REF}} \cdot Vinp,$$

where $I_{TP}$ denotes the current at the first output terminal, $R_{REF}$ denotes a fixed resistance, Vinp denotes a positive input voltage, and x denotes a range of a resistance of the first variable resistor.

Another aspect of the present invention provides an amplifier comprising: an input resistance unit including a first input resistance unit and a second resistance unit; an operational amplifier for operationally amplifying an output signal of the input resistance unit; and at least one resistor for negatively feeding back an output signal of the operational amplifier.

Here, the first input resistance unit has a first fixed resistor and a first variable resistor whose resistance is linearly variable. The first variable resistor and the first fixed resistor respectively receive a first input signal and a second input signal having a sign different from the first input signal. The signals output from the first fixed resistor and the first variable resistor are added and output to the operational amplifier.

The second input resistance unit has a second fixed resistor and a second variable resistor whose resistance is linearly variable. The second fixed resistor and the second variable resistor respectively receive the first input signal and the second input signal. The signals output from the second fixed resistor and the second variable resistor are added and output to the operational amplifier.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention.

The present invention suggests a gain control device capable of controlling dB-linear gain without changing a signal processing characteristic of an analog signal processing unit employing a resistive feedback amplifier (including a multiplying digital-to-analog converter (MDAC) combined with a DAC) or active-resistive and capacitive (RC) integrator when the gain control device is combined with the analog circuit, and an amplifier including the gain control device. In other words, the gain control device according to an exemplary embodiment of the present invention can control dB-linear gain separately from the combined analog signal processing unit.

A gain control device according to an exemplary embodiment of the present invention combinable with an analog signal processing unit, includes resistors or capacitors and can be applied to a circuit forming a negative feedback loop. The circuit may be, for example, a resistive feedback amplifier, a resistive MDAC combined with a DAC, an active-RC integrator, a continuous-time sigma-delta modulator (SDM), a continuous-time filter, and a continuous-time analog-to-digital converter (ADC).

After the basic concept of a gain control device according to an exemplary embodiment of the present invention is described, exemplary embodiments in which the gain control device is combined with an analog signal processing unit will be described.

Figure 1:
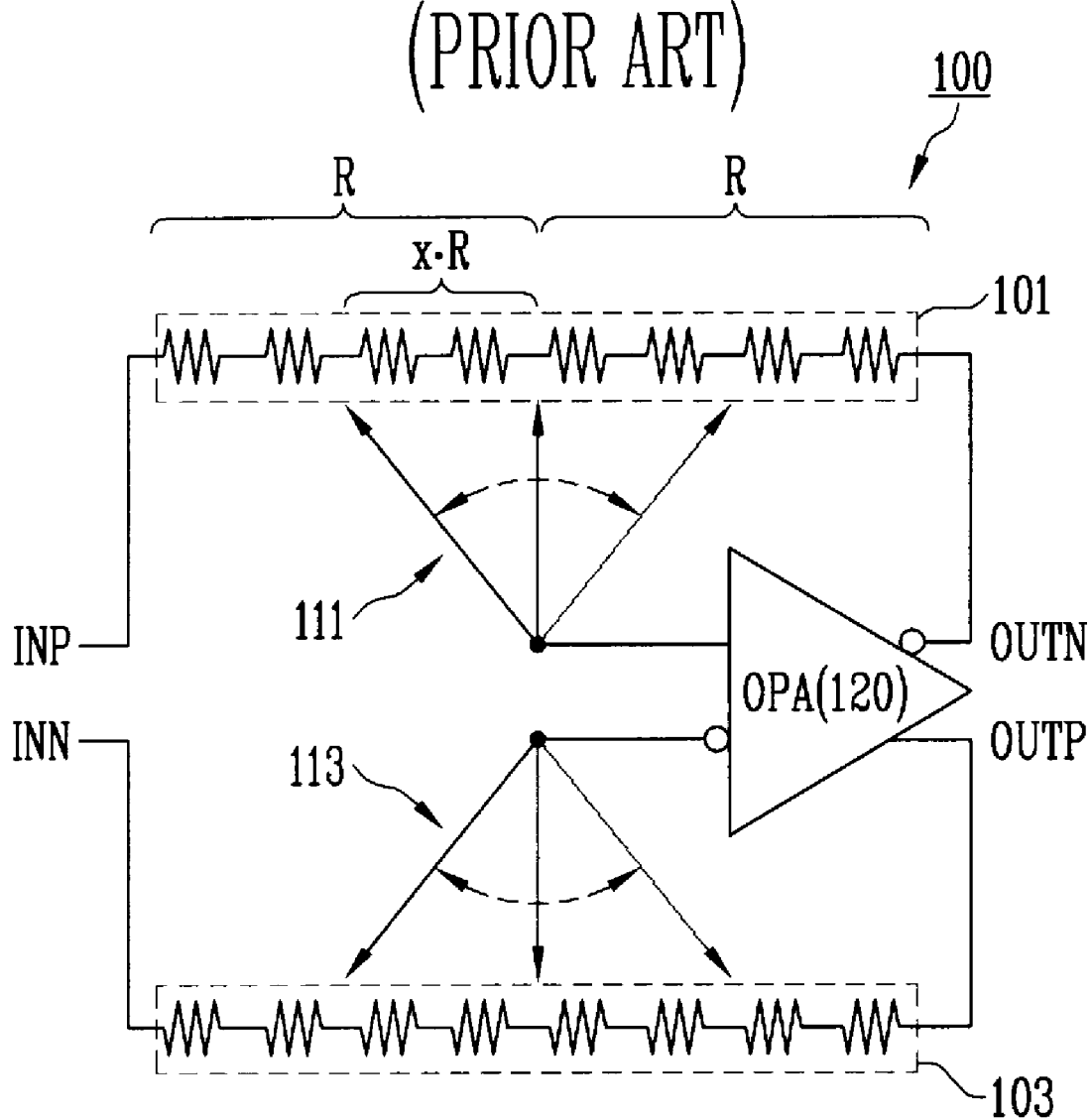
FIG. 1 illustrates a general dB-linear gain controller.
Figure 2:
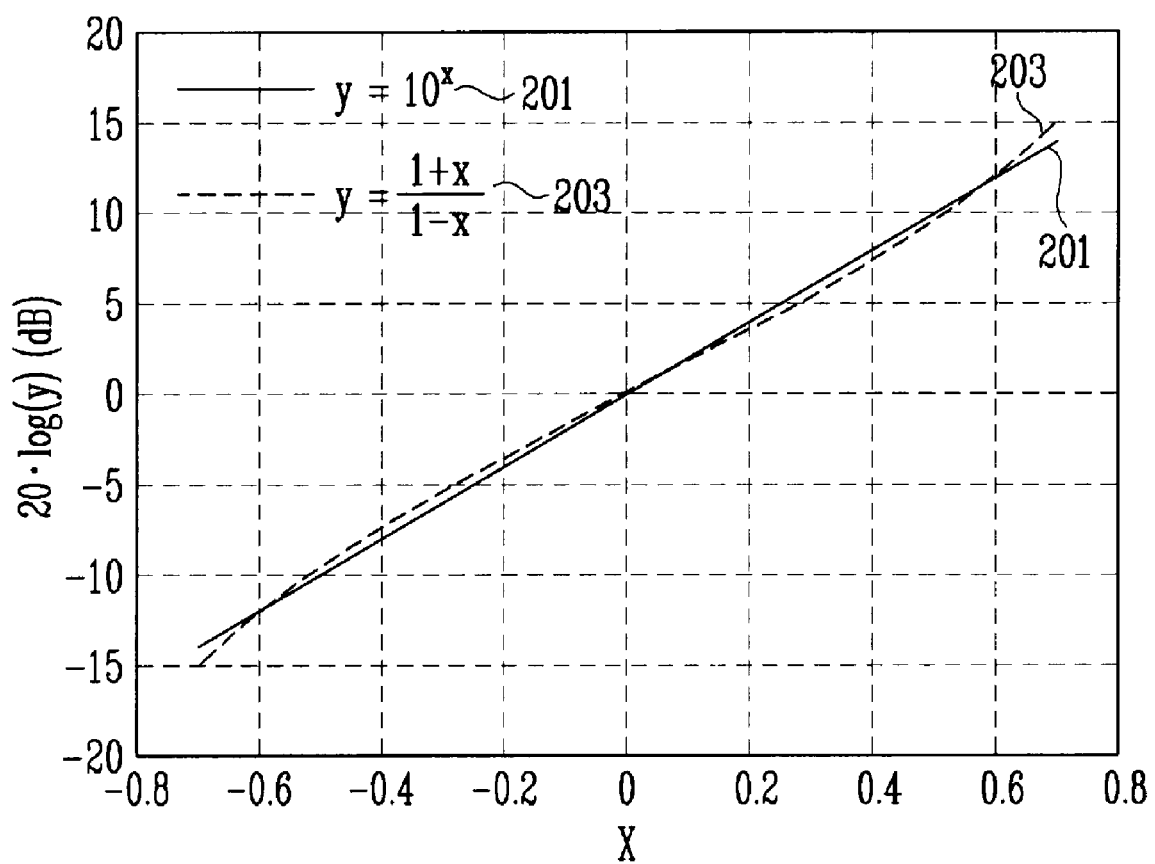
FIG. 2 shows graphs of an exponential function and an approximate exponential function.
Figure 3:
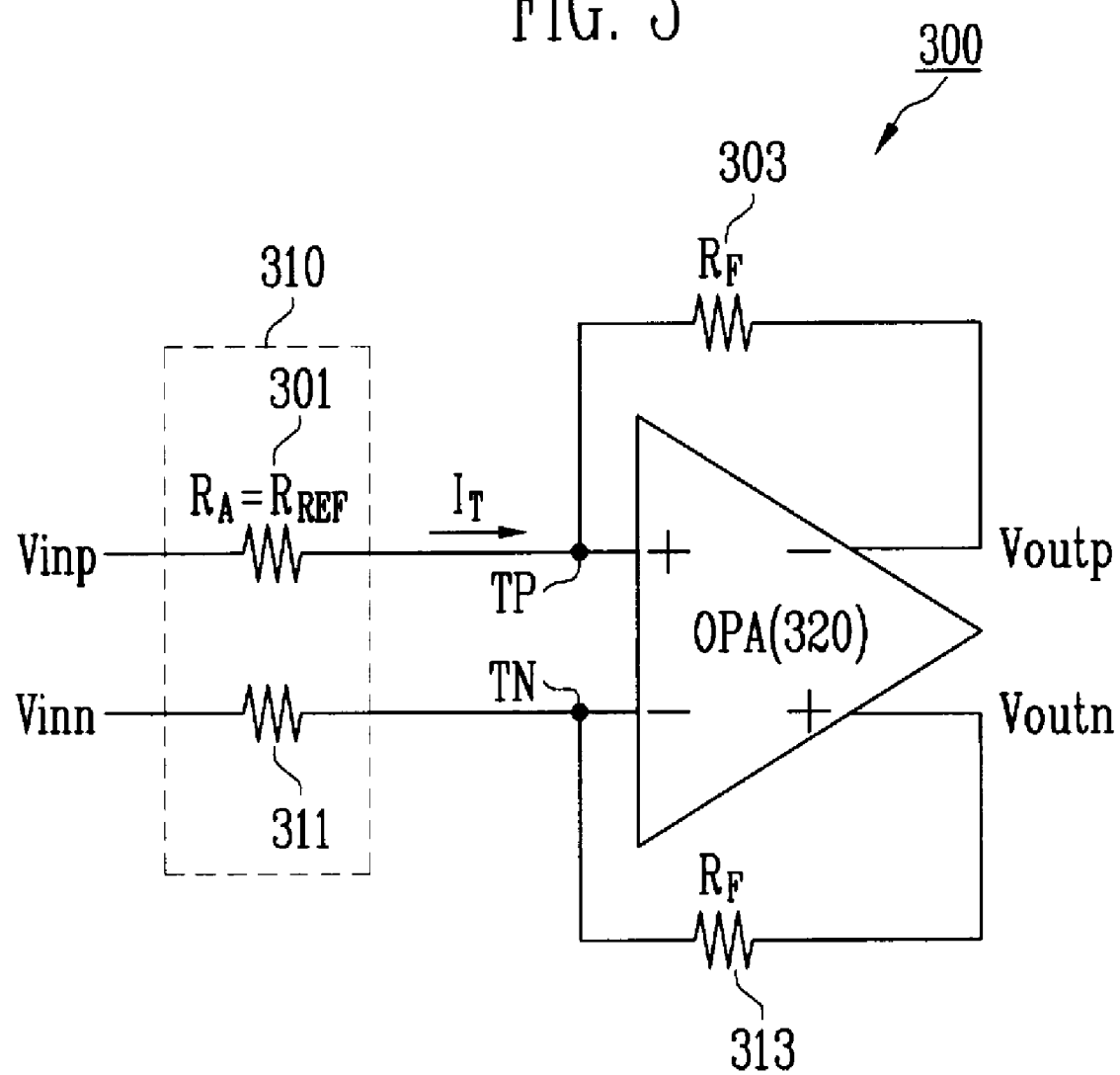
FIG. 3 illustrates a fully differential amplifier combined with a gain control device according to an exemplary embodiment of the present invention.

FIG. 3 is a diagram illustrating the basic concept of a gain control device, which is a fully differential amplifier 300, according to an exemplary embodiment of the present invention.

Referring to FIG. 3, the fully differential amplifier 300 includes an input resistor 310, an operational amplifier 320 operationally amplifying an output signal of the input resistor 310, and negative feedback resistors 303 and 313 negatively feeding back output signals of the operational amplifier 320. The relation between input and output voltages of the fully differential amplifier 300 is expressed by Equation 2 below.

$$(Voutp - Voutn) = \frac{R_F}{R_A} \cdot (Vinp - Vinn) \quad <\text{Equation 2}>$$

Here, $R_A$ denotes an input resistance of the input resistor 310, $R_F$ denotes a negative feedback resistance of the negative feedback resistors 303 and 313, Vinp and Vinn denote voltages of input signals, and Voutp and Voutn denote voltages of output signals.

As can be seen from Equation 2 above, gain of the fully differential amplifier 300 is $R_F/R_A$. Thus, gain control is enabled by adjusting the input resistance $R_A$ of the input resistor 310. In other words, control of only the input resistance $R_A$ of the input resistor 310 does not affect the values of the negative feedback devices 303 and 313 connected with the operational amplifier 320.

Accordingly, in the present invention, dB-linear gain control is performed without affecting the value of a negative feedback device connected with an operational amplifier instead of an input resistor. In this specification, the input resistor 310 is referred to as a gain control device.

Figure 4:
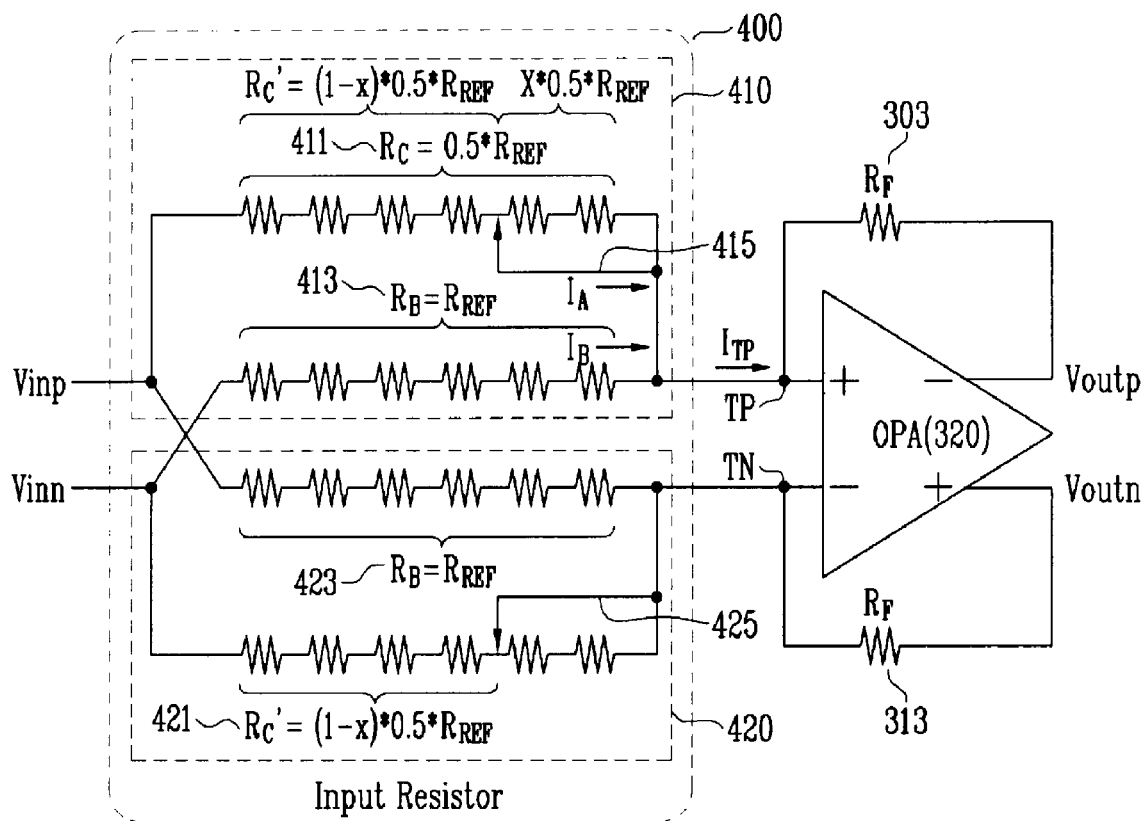
FIG. 4 illustrates in detail a gain control device according to an exemplary embodiment of the present invention.

FIG. 4 illustrates a gain control device 400 according to an exemplary embodiment of the present invention. Here, blocks other than the gain control device 400 are the same as those of the fully differential amplifier of FIG. 3.

Referring to FIG. 4, the gain control device 400 according to an exemplary embodiment of the present invention includes a first input resistance unit 410 and a second input resistance unit 420.

The first input resistance unit 410 includes a first variable resistor 411 whose resistance $R_C$ is linearly variable, and a first fixed resistor 413. The first variable resistor 411 is connected between a positive input signal Vinp and a virtual ground node TP, and the first fixed resistor 413 is connected between a negative input signal Vinn having a sign different from the positive input signal Vinp and the virtual ground node TP.

Here, the maximum resistance of the first variable resistor 411 may be half of a resistance $R_B$ of the first fixed resistor 413. However, the maximum resistance of the first variable resistor 411 may vary within a range smaller than the resistance $R_B$ of the first fixed resistor 413 to change an exponential characteristic.

The second input resistance unit 420 includes a second variable resistor 421 whose resistance is linearly variable, and a second fixed resistor 423. The second variable resistor 421 is connected between the negative input signal Vinn and a virtual ground node TN, and the second fixed resistor 423 is connected between the positive input signal Vinp and the virtual ground node TN.

Here, a resistance of the second fixed resistor 423 may be the same as the resistance $R_B$ of the first fixed resistor 413, and the maximum resistance of the second variable resistor 421 may be half of the resistance $R_B$ of the second fixed resistor 423. However, the maximum resistance of the second variable resistor 421 may vary within a range smaller than the resistance $R_B$ of the second fixed resistor 423 to change an exponential characteristic.

The first input resistance unit 410 and the second input resistance unit 420 have symmetrical structures.

Meanwhile, the gain control device 400 includes switching means 415 and 425 for linearly varying the resistances of the first variable resistor 411 and the second variable resistor 421, and the switching means 415 and 425 can be implemented in various ways.

The reason that the gain control device 400 according to an exemplary embodiment of the present invention can separately perform gain control will be described below.

As mentioned above, the maximum resistance of the first variable resistor 411 can be within a range smaller than the resistance $R_B$ of the first fixed resistor 413, and in the example above, the maximum resistance of the first variable resistor 411 is half of the resistance $R_B$ of the first fixed resistor 413. Thus, assuming that the resistance $R_B$ of the first fixed resistor 413 is $R_{REF}$, a range in which the resistance $R_C$ of the first variable resistor 411 can be linearly adjusted may be expressed by Equation 3 below.

$$R'_C = (1-X) \cdot 0.5 \cdot R_{REF} \quad <\text{Equation 3}>$$

Here, $R'_C$ denotes a range in which the resistance $R_C$ of the first variable resistor 411 can be linearly adjusted, and X is a random value ranging from 0 to 1.

Currents $I_A$ and $I_B$ respectively flowing through the resistors may be expressed by Equation 4 below. For convenience, it is assumed that an input signal and a virtual ground node have the same common mode voltage.

$$I_A = \frac{2}{(1-x) \cdot R_{REF}} \cdot Vinp \quad <\text{Equation 4}>$$

$$I_B = \frac{1}{R_{REF}} \cdot Vinn$$

Then, a current $I_{TP}$ applied to the virtual ground node TP is the sum of the currents $I_A$ and $I_B$, and expressed by Equation 5 below.

$$I_{TP} = \frac{1+x}{1-x} \cdot \frac{1}{R_{REF}} \cdot Vinp \quad <\text{Equation 5}>$$

As can be seen from Equation 5, the current $I_{TP}$ at the virtual ground node TP is an approximate exponential function with respect to a variable x.

Thus, when Equation 5 is substituted into the expression of Equation 2 showing the relation between input and output voltages of the fully differential amplifier 300, the expression showing the relation between input and output voltages of the fully differential amplifier 300 is calculated as shown in Equation 6 below.

$$(Voutp - Voutn) = \frac{1+x}{1-x} \cdot \frac{R_F}{R_{REF}} \cdot (Vinp - Vinn) \quad <\text{Equation 6}>$$

In the above expression showing the relation between input and output voltages, gain is $$\frac{1+x}{1-x} \cdot \frac{R_F}{R_{REF}}$$

and is an approximate exponential function with respect to the gain control variable x. Thus, in the gain control device 400 according to an exemplary embodiment of the present invention, the gain is dB-linearly controlled according to linear variation of the resistance $R_C$ of the variable resistor 411. Also, the negative feedback resistance $R_F$ has no connection with the change of resistance of a variable resistor, and thus the gain control device 400 according to an exemplary embodiment of the present invention can separately perform dB-linear gain control.

In the description above, the gain control device 400 according to an exemplary embodiment of the present invention is connected with the fully differential amplifier 300 having a resistor in a negative feedback loop. However, the gain control device 400 according to an exemplary embodiment of the present invention can be applied to a structure having a capacitor in a negative feedback loop, e.g., a continuous-time integrator and a continuous-time SDM, as well as a structure having a resistor in a negative feedback loop.

Figure 5:
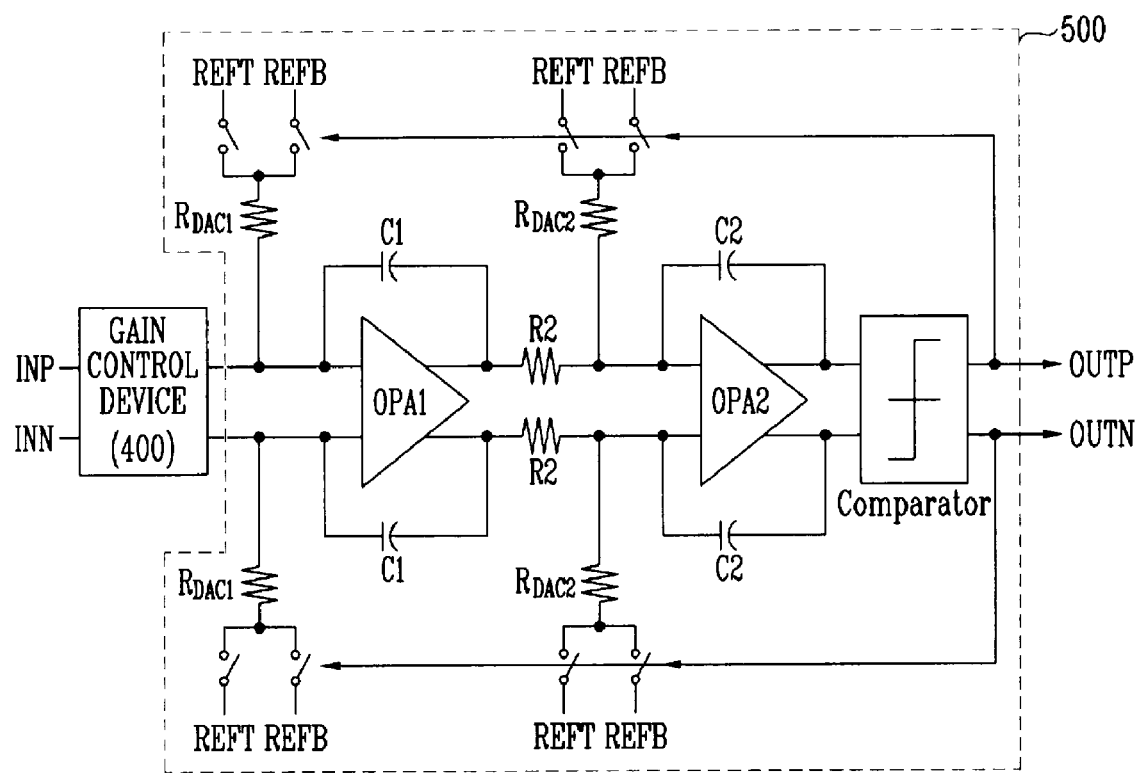
FIG. 5 illustrates a continuous-time sigma-delta modulator (SDM) combined with a gain control device according to an exemplary embodiment of the present invention.

FIG. 5 illustrates an example in which the gain control device 400 according to an exemplary embodiment of the present invention is combined with a continuous-time SDM 500.

Referring to FIG. 5, a loop of the continuous-time SDM 500 includes a first operational amplifier OPA1, first negative feedback capacitors C1, first resistors $R_{DAC1}$, a second operational amplifier OPA2, second negative feedback capacitors C2, second resistors $R_{DAC2}$, and a comparator. Thus, the gain control device 400 controls only a magnitude of an input signal applied to the SDM loop without affecting a loop characteristic of the SDM 500.

Figure 6:
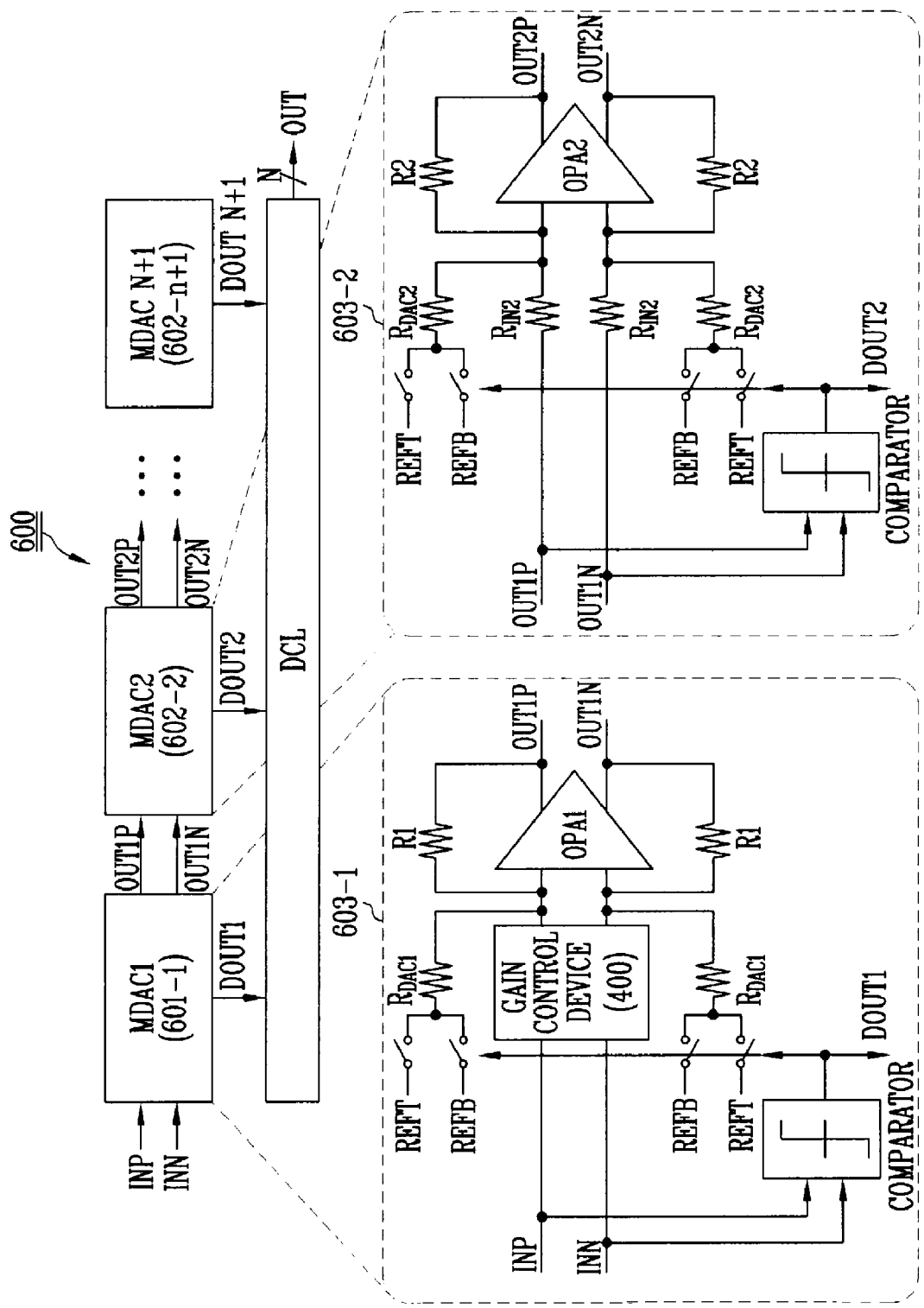
FIG. 6 illustrates a continuous-time pipeline analog-to-digital converter (ADC) combined with a gain control device according to an exemplary embodiment of the present invention.

FIG. 6 illustrates an example in which the gain control device 400 according to an exemplary embodiment of the present invention is combined with a continuous-time pipeline ADC.

Referring to FIG. 6, a signal processing characteristic of the pipeline ADC is determined by $R_{DAC1}$ and R1 constituting a DAC 603-1 of MDAC$_1$ 601-1, and the following MDACs MDAC$_2$, ..., MDAC$_{N+1}$. Thus, the gain control device 400 controls only a magnitude of an input signal applied to the pipeline ADC 600 without affecting a signal processing characteristic of the pipeline ADC 600.

The gain control device according to an exemplary embodiment of the present invention enables dB-linear gain control in a resistive feedback amplifier, an MDAC combined with a DAC, and an active-RC integrator regardless of a negative feedback device connected with an operational amplifier. Also, the gain control device can be employed in a more precise and complex gain control method using an analog block for gain control such as a variable gain amplifier (VGA), programmable gain amplifier (PGA), and automatic gain controller (AGC).

Further, even if the gain control device is connected with a resistive feedback amplifier, a continuous-time SDM using an active-RC integrator, a continuous-time filter, and a continuous-time ADC, it does not change characteristics of the SDM, continuous-time filter, and continuous-time ADC. Thus, the gain control device can be easily combined, and enables miniaturization and low power consumption.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A gain control device, comprising:
a first input resistance unit having a first variable resistor whose resistance is linearly variable and receiving a first input signal and a first fixed resistor receiving a second input signal having a sign different from the first input signal, adding signals output from the first fixed resistor and the first variable resistor, and outputting a first output current through a first output terminal; and
a second input resistance unit having a second fixed resistor receiving the first input signal and a second variable resistor whose resistance is linearly variable and receiving the second input signal, adding signals output from the second fixed resistor and the second variable resistor, and outputting a second output current through a second output terminal.

2. The gain control device of claim 1, wherein the first fixed resistor and the second fixed resistor have the same resistance, the first variable resistor and the second variable resistor have the same maximum resistance, and the maximum resistance of the first variable resistor and the second variable resistor is smaller than the resistance of the first fixed resistor and the second fixed resistor, respectively.

3. The gain control device of claim 2, wherein the maximum resistance of the first variable resistor and the second variable resistor is half of the resistance of the first fixed resistor and the second fixed resistor, respectively.

4. The gain control device of claim 1, wherein the first and second output terminals are virtual ground nodes.

5. The gain control device of claim 1, wherein resistances of the first variable resistor and the second variable resistor are linearly changed by switching means.

6. The gain control device of claim 1, wherein the first input signal is a positive signal, and the second input signal is a negative signal.

7. The gain control device of claim 1, wherein the first output current is $$I_{TP} = \frac{1+x}{1-x} \cdot \frac{1}{R_{REF}} \cdot Vinp,$$

where $I_{TP}$ denotes the current at the first output terminal, $R_{REF}$ denotes a resistance of the first fixed resistor, Vinp denotes a voltage of the first input signal, and x denotes a gain control variable of the first variable resistor.

8. An amplifier, comprising:
an input resistance unit including a first input resistance unit and a second resistance unit;
an operational amplifier for operationally amplifying an output signal of the input resistance unit; and
at least one resistor for negatively feeding back an output signal of the operational amplifier,
wherein the first input resistance unit has a first variable resistor whose resistance is linearly variable and a first fixed resistor, the first variable resistor and the first fixed resistor respectively receive a first input signal and a second input signal having a sign different from the first input signal, signals output from the first fixed resistor and the first variable resistor are added and output to the operational amplifier; and
the second input resistance unit has a second fixed resistor and a second variable resistor whose resistance is linearly variable, the second fixed resistor and the second variable resistor respectively receive the first input signal and the second input signal, signals output from the second fixed resistor and the second variable resistor are added and output to the operational amplifier.

9. The amplifier of claim 8, wherein the first fixed resistor and the second fixed resistor have the same resistance, the first variable resistor and the second variable resistor have the same maximum resistance, and the maximum resistance of the first variable resistor and the second variable resistor is smaller than the resistance of the first fixed resistor and the second fixed resistor, respectively.

10. The amplifier of claim 9, wherein the maximum resistance of the first variable resistor and the second variable resistor is half of the resistance of the first fixed resistor and the second fixed resistor, respectively.

* * * * *